United States Patent [19]

Forehand et al.

[11] Patent Number: 4,675,649
[45] Date of Patent: Jun. 23, 1987

[54] APPARATUS AND METHOD FOR INTERFACING A TRANSDUCER

[75] Inventors: Gilbert H. Forehand; Michael J. Lynch, both of Duncan, Okla.

[73] Assignee: Halliburton Company, Duncan, Okla.

[21] Appl. No.: 775,063

[22] Filed: Sep. 11, 1985

[51] Int. Cl.⁴ .............................................. H03M 1/56
[52] U.S. Cl. ....................... 340/347 AD; 340/347 NT
[58] Field of Search ................ 340/347 AD, 347 NT; 324/99 D; 328/150

[56] References Cited

U.S. PATENT DOCUMENTS

| | | |
|---|---|---|
| 3,062,052 | 11/1962 | Kolb . |
| 3,116,448 | 12/1963 | Vogel . |
| 3,256,426 | 6/1966 | Roth .............................. 340/347 NT |
| 3,434,105 | 3/1969 | Schwartz . |
| 3,490,286 | 1/1970 | Schwartz . |
| 3,559,163 | 1/1971 | Schwartz . |
| 3,588,908 | 6/1971 | Lindsey . |
| 3,618,001 | 11/1971 | Zill et al. . |
| 3,930,220 | 12/1975 | Shawhan . |
| 3,942,172 | 3/1976 | Tucker ......................... 340/347 NT |
| 3,977,245 | 8/1976 | Clark et al. . |
| 4,112,428 | 9/1978 | Dorsman ....................... 340/347 NT |
| 4,157,659 | 6/1979 | Murdock . |
| 4,195,349 | 3/1980 | Balkanli . |
| 4,417,234 | 11/1983 | McKenna .................... 340/347 NT |

OTHER PUBLICATIONS

Bares, "IBM Technical Disclosure Bulletin", vol. 10, No. 9, Feb. 1968, pp. 1372–1373.

Primary Examiner—Charles D. Miller
Attorney, Agent, or Firm—Joseph A. Walkowski; E. Harrison Gilbert, III

[57] ABSTRACT

An analog-to-digital conversion technique utilizes an oscillator which provides a primary oscillating signal that drives a counter and that generates a derived signal having a frequency less than the primary signal. The derived signal is integrated for use in comparing against the threshold voltage defining the analog signal to be converted. The comparison of the integrated and the threshold signals provides a pulse width modulated signal which is related to the primary signal. The pulse width modulated signal gates the counter for generating a count at the rate established by the primary signal. This output can be communicated to a microcomputer or other device.

2 Claims, 1 Drawing Figure

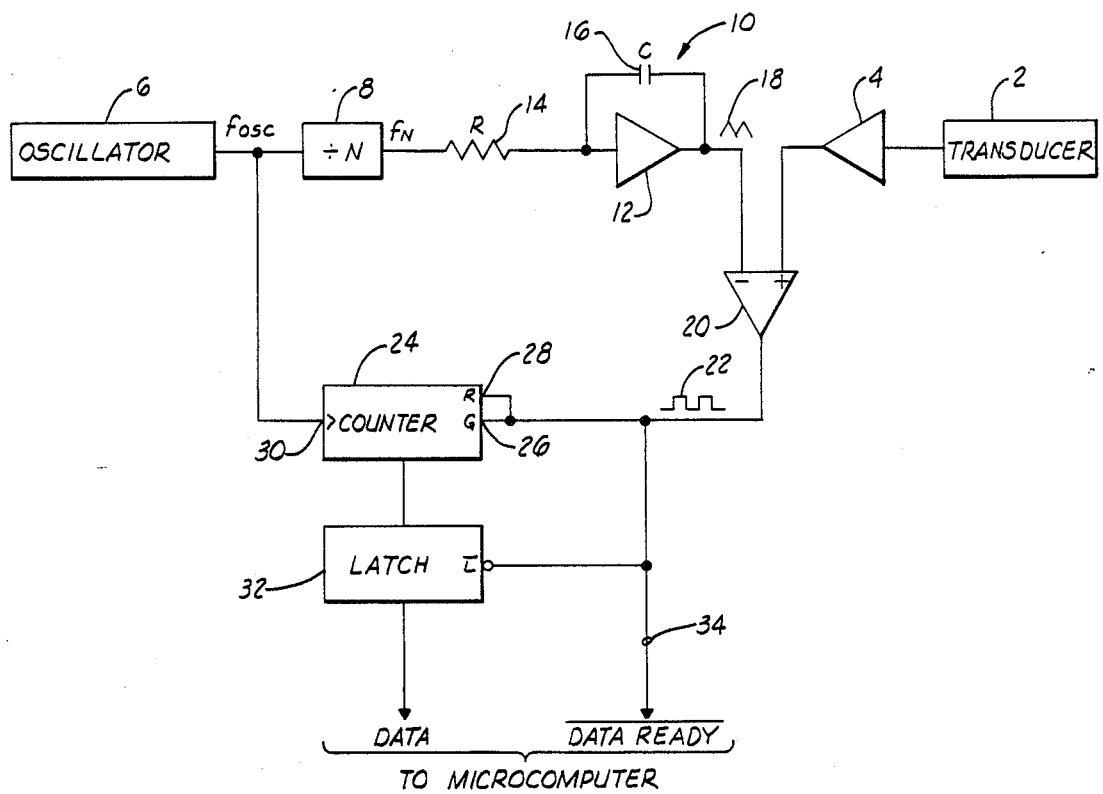

APPARATUS AND METHOD FOR INTERFACING A TRANSDUCER

BACKGROUND OF THE INVENTION

This invention relates generally to apparatus and methods for converting voltage magnitudes into digital counts and more particularly, but not by way of limitation, to apparatus and methods for interfacing a transducer providing a discrete analog voltage with a microcomputer or other digitally operating device.

The need for analog-to-digital conversion, whereby discrete voltage levels are converted into digital formats, is well known. For example, in digital monitoring and control systems, transducers, used to sense parameters such as temperature and pressure, provide discrete analog voltages which must be converted into digital values for use by the digital monitoring and control equipment. That is, such a transducer converts the temperature or pressure, for example, into a voltage level representative of the magnitude of the parameter. To use this voltage with a digital system which is capable of functioning only in response to two voltage levels representing either a logic zero or a logic one, the transducer signal needs to be converted into a digital format.

We are aware of two general techniques by which digital conversion can be accomplished. Both of these techniques convert the voltage from the transducer into an oscillating signal through a voltage controlled oscillator or the like. In one of these techniques, this oscillating signal gates a counter which thereupon counts another oscillating signal having a known frequency so that the count of the known frequency signal is proportional to the transducer signal. In the other technique, the oscillating signal from the transducer is counted by a counter gated by the oscillating signal of known frequency. In both of these techniques, the gating signal and the counting signal are independent; therefore, to insure accuracy, an oscillator which is stable over a long period of time needs to be used to provide the signal with the known frequency.

To obviate the necessity of using an oscillator having such long-term stability, there is the need for an improved analog-to-digital conversion technique wherein the gating and counting signals are related so that stability is required only within each counting period. It is also desirable for such a technique to provide rapid, high resolution conversion for use by high speed devices, such as microcomputers, in accurately monitoring the parameter or using the information to accurately control a system in response to the detected parameter. It is also desirable for such a technique to have a degree of programmability so that the resolution of the conversion can be controlled.

SUMMARY OF THE INVENTION

The present invention overcomes the above-noted and other shortcomings of the prior art by providing a novel and improved apparatus and method for, in the preferred embodiment, interfacing a transducer by converting the analog transducer output into a digital count. The present invention utilizes related gating and counting signals so that long-term stability of the basic oscillator utilized within the present invention is not required. Furthermore, the present invention provides rapid, high resolution analog-to-digital conversion, the resolution of which can be programmed in the preferred embodiment.

Broadly, the apparatus of the present invention converts a voltage magnitude into a digital count. This apparatus comprises oscillator means for generating a first signal having a first frequency; modulation means, responsive to the first signal and to the voltage magnitude, for generating a second signal having a second frequency less than the first frequency; and counter means, having a gating input connected to the modulation means and having a counting input connected to the oscillator means, for counting the periods of the first signal received during a count time defined by the second signal so that the number of periods counted is proportional to the voltage magnitude. In the preferred embodiment, the apparatus further includes means, such as a latch, for connecting the counter means to a microcomputer and means for connecting the second signal to the microcomputer for use as a data ready indicating signal.

In the preferred embodiment, the modulation means includes divider means for converting the first signal into an initial signal having the second frequency; integrator means for integrating the initial signal into an integrated signal; and comparator means for comparing the integrated signal and the voltage magnitude so that the second signal is thereby generated.

By the method of the present invention, a transducer is interfaced by generating a first oscillating signal at a first frequency; generating from the first oscillating signal a second oscillating signal having a second frequency which is less than the first frequency; integrating the second oscillating signal so that an integrated signal is generated; comparing the integrated signal with a signal proportional to a signal from the transducer so that a pulse width modulated signal is generated; and gating a counter driven by the first oscillating signal with the pulse width modulated signal so that the counter counts the first oscillating signal only during periods when the counter is gated on by the pulse width modulated signal. In the preferred embodiment the count of the counter and the pulse width modulated signal are communicated to a microcomputer.

Therefore, from the foregoing, it is a general object of the present invention to provide a novel and improved apparatus and method for converting a voltage magnitude into a digital count, such as for interfacing a transducer with a microcomputer. Other and further objects, features and advantages of the present invention will be readily apparent to those skilled in the art when the following description of the preferred embodiment is read in conjunction with the accompanying drawing.

BRIEF DESCRIPTION OF THE DRAWING

The FIGURE is a schematic circuit diagram of the apparatus of the preferred embodiment of the present invention.

DETAILED DESCRIPTION OF THE PREFERRED EMBODIMENT

With reference to the drawing, the apparatus of the preferred embodiment, by which a transducer can be interfaced to a microcomputer using a synchronous, ratio-metric, pulse width modulation technique allowing for rapid acquisition of the transducer signal at a resolution limited only by the period of an oscillator, will be described. This apparatus can be more generally adapted to convert a voltage magnitude into a digital count; however, for the preferred embodiment described herein, reference will be made to its use with a transducer 2 of a suitable type as known to the art, such as one capable of detecting a temperature or pressure and converting it into an analog voltage output. Associated with the transducer is an amplifier 4, also of suitable type for amplifying the transducer output to an appropriate voltage level to be used with the present invention.

The preferred embodiment of the present invention broadly includes means for providing a clocking signal having a frequency; modulation means, responsive to the clocking signal and to the voltage magnitude from the transducer, for generating another signal having another frequency less than the initial frequency; and counter means, responsive to the clocking signal and the signal from the modulation means, for generating a digital count corresponding to the magnitude of the parameter sensed by the transducer.

The means for providing a clocking signal is shown in the drawing as being particularly provided through an oscillator means 6 for generating the signal at a frequency $f_{osc}$. The oscillator 6 is of any suitable type as known to the art; however, it does not need to be one having long-term stability because the stability within the preferred embodiment need only be maintained for one period of a signal derived from the clocking signal, which derived signal is shown in the drawing as having a frequency $f_N$ provided within the modulation means in response to the clocking signal.

The derived signal having the frequency $f_N$ is provided through a divider means for converting the clocking signal into the derived signal. In the preferred embodiment the divider means includes a divide-by-N counter 8 which divides the $f_{osc}$ clocking signal provided at a count input of the counter 8 by a factor N, which in the preferred embodiment is programmable by using a suitable digital counter device as known to the art. The programmability of the counter 8 allows the preferred embodiment to have a variable resolution. In operation, the counter 8 divides the input clocking signal to provide a fifty percent duty cycled square wave signal at its output. As mentioned, the counter 8 can be of a suitable type as known to the art; however, it is preferably one which has, or can be controlled to have, a stable amplitude at its output for accurate control of an integrator means forming another part of the modulation means.

The integrator means is generally identified in the drawing by the reference numeral 10. The integrator means 10 integrates the square wave signal from the counter 8 into an integrated signal having a triangular waveform. In the illustrated embodiment, the integrator means 10 includes an amplifier 12 having an input connected by resistive means, including a resistor 14, to the output of the counter 8. The output and input of the amplifier 12 are interconnected by capacitive means including a capacitor 16. In this configuration for constructing an integrator as known to the art, the integrator means 10 provides an output mathematically characterized as $$v_o = 1/RC \int_{t_1}^{t_2} v\, dt$$

where the period $t_1$ to $t_2$ is one-half a cycle of the signal. This output signal is schematically illustrated in the drawing and identified by the reference numeral 18.

The signal 18 is provided to the inverting input of a comparator means 20 forming still another part of the modulation means of the present invention. The comparator means 20 also has a non-inverting input which is connected to the output of the amplifier 4 for receiving the amplified output from the transducer 2. In the preferred embodiment the comparator means 20 is provided by a suitable differential amplifier suitably constructed to perform the comparison function. In performing this function, the comparator means 20 compares the integrated signal 18 with the voltage magnitude from the amplifier 4 to provide a pulse signal 22 wherein each pulse within the stream of pulses of the signal 22 has a width directly proportional to the output of the transducer 2. This is achieved by having the output from the amplifier 4 set the threshold against which the triangular signal 18 is compared. As the voltage magnitude from the amplifier 4 varies, this varies the point at which the triangular wave 18 causes the comparator means 20 to generate a pulse of the signal 22. Therefore, the signal 22 may be more specifically referred to as a pulse width modulated signal.

The counter means of the preferred embodiment includes a digital counter 24 of a suitable type as known to the art. The counter 24 has a gate input 26 and a reset input 28, both of which are connected to the modulation means, specifically to the output of the comparator means 20. In the preferred embodiment, the counter 24 is of a type which is reset when a rising edge of the signal 22 is received at the reset input 28 and which is activated to count when the rising edge of the signal 22 is received at the gate input 26.

The counter 24 also includes a counting input 30 which is connected to the oscillator 6 for receiving the clocking signal having the frequency $f_{osc}$. Therefore, when the counter 24 is reset and gated upon the rising edge of the signal 22, the counter 24 counts at the rate of the clocking signal having the frequency $f_{osc}$ until the next falling edge of the signal 22 is received at the gating input 26, which falling edge deactivates the gating input 26 and the counter 24. Thus, the counter 24 effectively counts the number of periods of the clocking signal received during a count time defined by each pulse of the pulse width modulated signal 22 so that the number of periods counted is proportional to the voltage magnitude setting the threshold at the non-inverting input of the comparator means 20. In the preferred embodiment, the counter 24 has a sufficient number of bits in its output to achieve a count corresponding to the factor N programmed into the counter 8.

From the foregoing description of the construction and operation of the preferred embodiment of the present invention, it is apparent that both the gating and clocking signals, which are used by the counter 24 in generating the ultimate count which is proportional to the output of the transducer 2, are related so that the stability of the oscillator 6 need be maintained only during each counting period defined by each pulse of the signal 22. That is, if the period or frequency of the primary signal changes, the period or frequency of the derived signals controlling the switching of the comparator means 20 (and thus the period or frequency of the signal 22) will similarly change, thereby maintaining automatically compensated control of the counter 24 to provide consistent counts.

To utilize the present invention in specifically interfacing the transducer with a microcomputer, the preferred embodiment of the present invention further includes a latch means 32 for interfacing the digital count with a microcomputer (not shown). The latch means is of any suitable type having a sufficient number of inputs for receiving the number of bits of output from the counter 24. The latch 32 also includes a latch or load input connected to the comparator means 20 for receiving the pulse width modulated signal 22. In the preferred embodiment, latching or loading occurs upon the falling edge of each pulse of the signal 22.

The means for communicating with the microcomputer also includes a conductor 34 providing means for connecting the signal 22 to the microcomputer as a data ready signal as indicated in the drawing.

To more specifically illustrate the operation of the present invention, a specific example of signal levels will be described. For example, the integrator means 10 may be constructed so that the signal 18 has a 12-volt peak-to-peak output range between zero and 12 volts. The amplifier 4 can be constructed to provide an output within the range between 1 and 11 volts in response to the output from the transducer 2. This combination of ranges will insure proper operation of the comparator means 20 in generating the pulse width modulated signal 22.

The counter 8 is suitably programmed to select the desirable divisor, which in this specific example will be selected to be 1,000 to provide a 1/1000-th resolution. The factor N is selected based on the expected rate of change, or slew rate, of the data to insure adequate accuracy. If $f_N$ is significantly greater than the slew rate, the error will be less than 1/N.

With the foregoing construction, the method of the present invention is implemented. This method includes generating the clocking signal at the frequency $f_{osc}$ and generating therefrom the signal having the frequency $f_N$. This $f_N$ signal is integrated so that the signal 18 is provided. The signal 18 and the voltage from the amplifier 4 are compared so that the pulse width modulated signal 22 is generated. This pulse width modulated signal 22 gates the counter 24, which is then driven by the clocking signal having the frequency $f_{osc}$ so that the counter 24 counts at the $f_{osc}$ rate only during periods when the counter 24 is gated on by the pulse width modulated signal. Once a count is established, it can be communicated, such as to a microcomputer, through the latch 32 upon the falling edge of a pulse within the signal 22, which pulse indicates to the microcomputer that data have been latched in the latch 32.

Thus, the present invention provides an analog-to-digital conversion apparatus and method which provides rapid, high resolution interfacing of a transducer. The technique utilizes an oscillator, the long-term stability of which is not critical. In the preferred embodiment the resolution is programmable.

Thus, the present invention is well adapted to carry out the objects and attain the ends and advantages mentioned above as well as those inherent therein. While a preferred embodiment of the invention has been described for the purpose of this disclosure, numerous changes in the construction and arrangement of parts and the performance of steps can be made by those skilled in the art, which changes are encompassed within the spirit of this invention as defined by the appended claims.

What is claimed is:

1. A method of interfacing a transducer with a microcomputer, comprising:

generating a first oscillating signal at a first frequency which is stable during at least a counting period;

generating from the first oscillating signal a second oscillating signal having a second frequency which is less than the first frequency;

integrating the second oscillating signal so that an integrated signal is generated;

comparing the integrated signal with a signal proportional to a signal from the transducer;

generating a pulse width modulated signal in response to the compared integrated signal and the signal proportional to a signal from the transducer and in response to changes in the first frequency;

both resetting and gating a counter with the pulse width modulated signal so that the counter is activated to count during each counting period defined by a respective pulse of the pulse width modulated signal;

driving the counter with the first oscillating signal so that the counter provides a count of the cycles of the first oscillating signal during each counting period, wherein each count is made consistent with each other count of different counting periods by changes in the pulse width modulated signal responsive to changes in the first frequency;

loading each count from the counter into a latch in response to the end of the respective pulse during which the count loaded was made; and communicating the pulse width modulated signal to the microcomputer and indicating, by the end of the respective pulse during which the count loaded was made, that a count has been loaded into the latch means.

2. An apparatus for interfacing a transducer to a microcomputer using a synchronous, ratio-metric, pulse width modulation technique, said apparatus comprising:

means for connecting to the transducer and for providing a voltage in response to an output from the transducer;

oscillator means for generating a first signal having a first frequency which is stable during at least a counting period;

divider means, connected to said oscillator means, for converting said first signal into a second signal having a second frequency which is less than said first frequency;

integrator means, connected to said divider means, for converting said second signal into an integrated signal;

comparator means for comparing said integrated signal and said voltage and for providing in response thereto a stream of pulses wherein each pulse within said stream has a width directly proportional to said voltage and wherein each pulse within said stream is defined at a frequency which automatically changes in response to a change in said first frequency, and said comparator means including:

an inverting input connected to said integrator means; and a non-inverting input connected to said means for connecting to the transducer and for providing a voltage in response to an output from the transducer;

a counter, including:

an output;

a reset input and a gate input, both said reset input and said gate input connected to said comparator means for receiving said stream of pulses; and a counting input connected to said oscillator means for receiving said first signal, so that for each pulse of said stream of pulses received at both said reset input and said gate input said counter provides through said output a count of the cycles of said first signal received through said counting input during said counting period, which said counting period is defined by the width of the respective pulse then being received through said reset input and said gating input so that said counter resets and starts a count at the beginning of the respective pulse and ends the count at the end of the respective pulse and which said counting period is compensated for any change in said first frequency so that said counter is automatically compensated to provide consistent counts;

latch means, connected to said output of said counter and to said comparator means, for loading a respective count from said counter means into said latch means in response to the end of the same respective pulse during which the respective count was made;

means for connecting said latch means to the microcomputer; and means for connecting said comparator means to the microcomputer so that said stream of pulses provided by said comparator means is communicated to the microcomputer, wherein the end of each respective pulse to which said latch means is responsive also indicates to the microcomputer that a count has been then loaded into said latch means.

* * * * *